Nov. 8, 1960 L. A. BAIN, JR., ET AL 2,958,928

METHODS OF MAKING PRINTED WIRING CIRCUITS

Filed Dec. 14, 1955 2 Sheets-Sheet 1

INVENTORS
L. A. BAIN, JR.
R. A. GESHNER
BY J. K. Hall
ATTORNEY

Nov. 8, 1960 L. A. BAIN, JR., ET AL 2,958,928

METHODS OF MAKING PRINTED WIRING CIRCUITS

Filed Dec. 14, 1955

2 Sheets-Sheet 2

INVENTORS
L. A. BAIN, JR.
R. A. GESHNER
BY J. R. Hall
ATTORNEY

United States Patent Office 2,958,928

Patented Nov. 8, 1960

2,958,928

METHODS OF MAKING PRINTED WIRING CIRCUITS

Lewis A. Bain, Jr., Hinsdale, Ill., and Robert A. Geshner, Rochester, N.Y., assignors to Western Electric Company, Incorporated, New York, N.Y., a corporation of New York Filed Dec. 14, 1955, Ser. No. 553,127

1 Claim. (Cl. 29—155.5)

This invention relates to methods of making printed wiring circuits, and more particularly to etched foil methods of making printed wiring boards.

An object of the invention is to provide new and improved methods of making printed wiring circuits having conductive strips on one face of insulating mounting boards.

Another object of the invention is to provide new and improved methods of making printed wiring boards from copper foil and phenol-fiber boards by photo-mechanically printing and etching.

In a method of making printed wiring circuits illustrating certain features of the invention, sheets of copper are placed on opposite sides of an uncured buildup of phenol-fiber, the sheets of copper are pressed tightly against the phenol-fiber buildup, which is compressed to a phenol-fiber board, a photo-sensitive, electrically insulating resist is sprayed on the open face of the copper sheets, negatives or light masks of desired circuit terminals are placed on the resist-covered copper sheets and the portions of the boards exposed by the masks are exposed to light to fix or set the resist on the copper facing, the unexposed portions being terminal areas in superposed positions on opposite sides of the panel. Then the unset portions of the resist are dissolved to leave the terminal portions free of resist, the terminal portions are gold plated, and the remainder of the resist is dissolved in an acid bath. Wiring patterns including the terminal portions then are printed photo-mechanically with a resist to form predetermined patterns on the sheets, and the uncovered portions of the copper sheets are etched away, after which the resist is removed and the boards are coated with lacquer and cut to board sizes.

A complete understanding of the invention may be obtained from the following detailed description of a method forming one embodiment of the invention, when read in conjunction with the appended drawings, in which.

Figure 1:
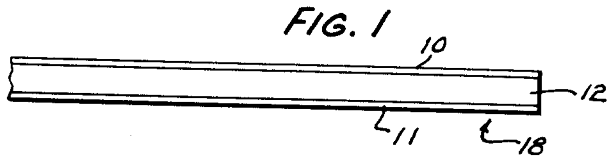
Figs. 1 and 2 are elevations of printed wiring boards at steps of a method forming one embodiment of the invention.
Figures 8, 9, 10:
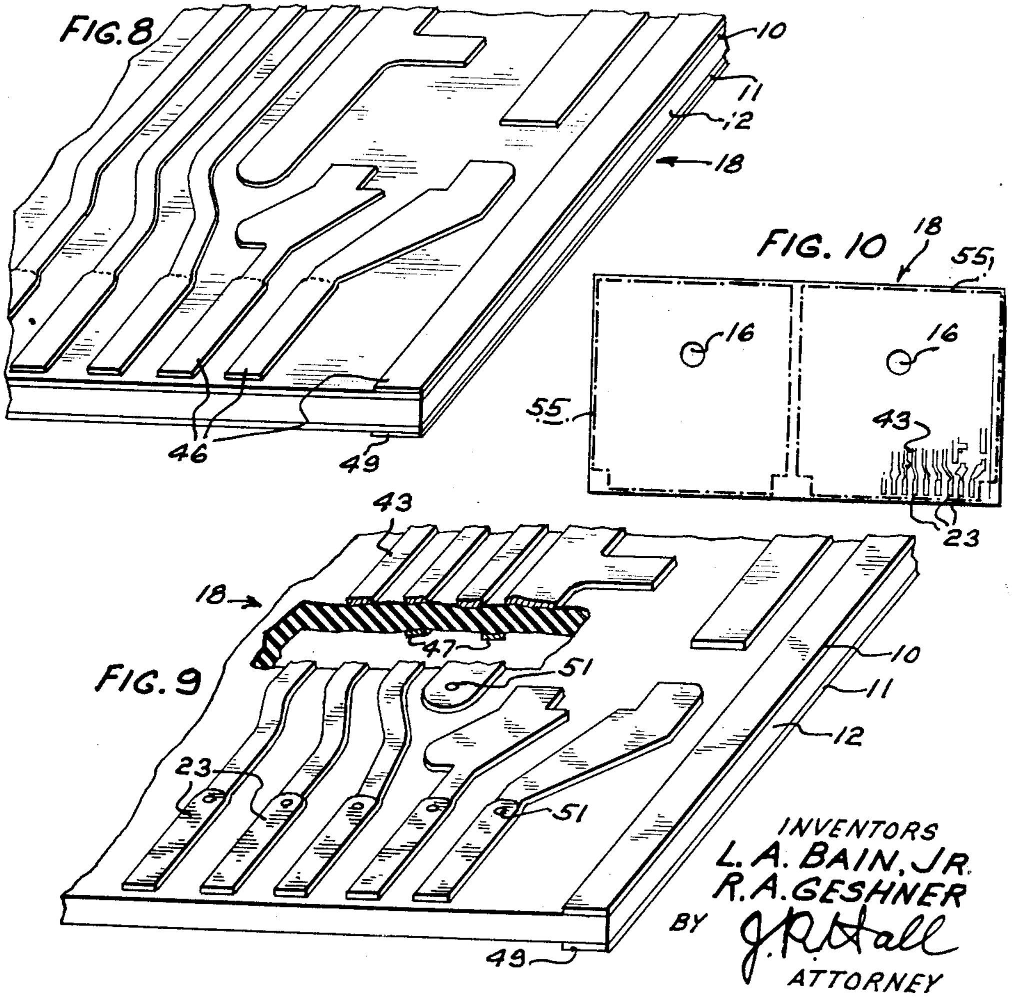
Fig. 10 is a top plan view of the boards.

Referring now in detail to the drawings, thin sheets or foils 10 and 11 (Figs. 1 and 2) of copper or other suitable electroconductive material are placed on a sheet or pileup 12 of electrical insulating material, such as, phenol-fiber, which in the present instance is XXXP grade phenol-fiber and is shown in a cured condition. The sheets 10 and 11 are pressed tightly against the sheet 12 by a suitable press (not shown). The sheet 12 is subjected to heat while under pressure and is cured which bonds the copper sheets or foils 10 and 11 closely to the opposite surfaces of the sheet 12. The faces of the sheets 10 and 11 adjacent to the sheet 12 have a suitable adhesive thereon, for example, a polyvinyl butyral-phenolic type adhesive. One suitably adhesive is Permacel's P–195 adhesive. The composite structure then is removed from the press and holes 16 (Fig. 10) are bored therethrough. The holes 16 are for receiving electrical components, such as vacuum tubes, and also are used as pilot or locating holes in the processing of the panels. The resulting structure is sawed into panels 18 of a multi-board size, and the panels so formed have their edges sanded to deburr them. The deburring also may be effected by any suitable milling machine.

Figure 2:
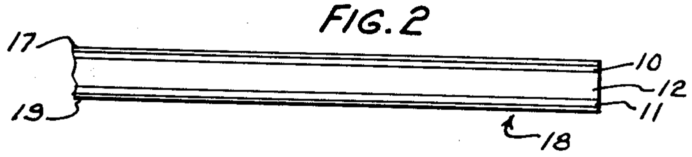
Figure 3:
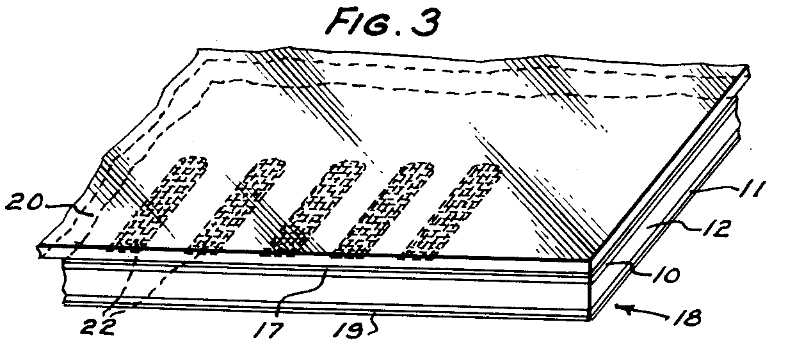
Figs. 3, 4 and 5 are perspective views of the printed wiring boards at steps of the method.
Figures 4, 5:
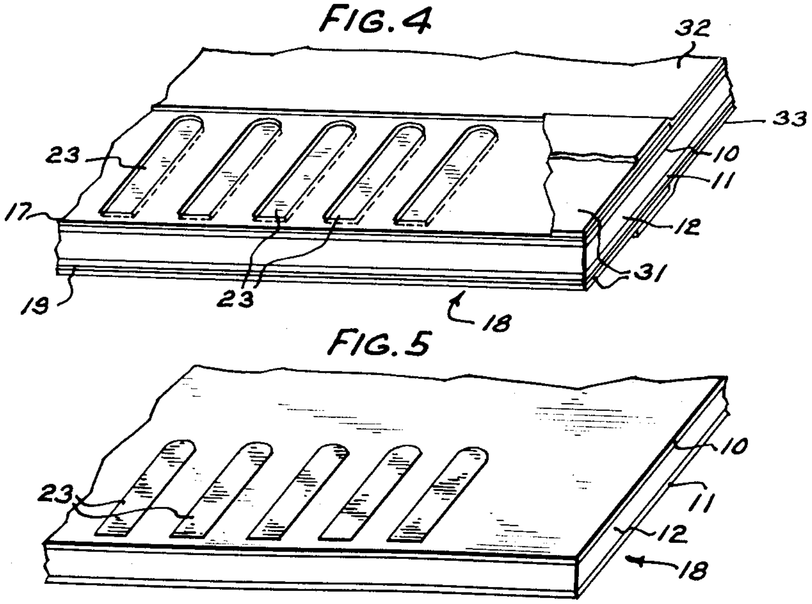

The panels 18 are degreased with trichloroethylene vapor and are dipped in hydrochloric acid to remove oxides. Photo-resist composed of a well known photo-sensitive electrical insulating material is sprayed on sheets 10 and 11 and air dried in darkness to form layers 17 and 19 (Figs. 2, 3 and 4). A suitable photo-resist is Kodak resist manufactured by Eastman Kodak Company. A film negative 20 is placed over the sheet 10, and located precisely by matching holes in the negative with the holes 16 by use of locating pins. The panel with the negative is placed in a vacuum frame (not shown) of a well known type and the negative is exposed to carbon arc light for five minutes. This fixes the portions of the photo-resist layer 17 below transparent portions of the negative 20 without affecting portions of the photo-resist beneath opaque portions 22 of the negative, which correspond in shape, size and position to terminals 23 of the final printed wiring boards 24.

Then the negative 20 is removed from the sheet 10 and another negative is placed on the photo-resist layer 19 covering sheet 11 in a position in which opaque portions of the negative exactly register with the positions previously occupied by the opaque portions 22, this being accomplished by matching the holes in the negative with the holes 16 by locating pins. The panel and the negative then are placed in the vacuum frame, and the negative 20 is again exposed to carbon arc light to fix all portions of the photo-resist layer 19 on the sheet 11 except those portions under the opaque portions 22, which are masked and are unaffected by the exposure. Then the photo-resist layers 17 and 19 on both sides of the panel are developed in a Kodak developer which dissolves only the unexposed portions of the photo-resist from the sheets 10 and 11 to bare the portions of the sheet 10 to be the terminals 23 and the corresponding portions of the sheet 11 registering with the terminals 23.

The photo-resist layers 17 and 19 on the sheets 10 and 11 then are dyed with a dye of a well known type, such as Kodak Photo-Resist Dye, to make the photo-resist layers visible to check coverage on the panel. White opaquing paint of a well known type such as Nazdar silk screen ink is then applied, if necessary, to replace any omission of the photo-resist, excepting the terminal portions of the sheets 10 and 11. Masking tapes 31 are placed over the portions of the panel including the terminal portions, and the panel is sprayed on both sides with an electrically insulating asphalt varnish such as 84–W asphalt varnish supplied by the Sterling Varnish Company to form layers 32 and 33. Then the masking tapes are removed. If desired, masking tapes of an electrically insulating composition impervious to gold cyanide solution, having openings slightly larger than the terminals, may be placed on the portions of the panel left by the tapes 31 with the openings registering with the portions 23 of the panel not covered by the photo-resist.

The panel 18 then is placed in a gold-plating bath having a well known cyanide gold-plating solution therein. The foils 10 and 11 are made cathodic and a thin layer of gold, in the order of 0.0002 inch, is plated on the portions of the sheets 10 and 11 not covered by the photo-resist layers 17 and 19. Then the panel is removed from the bath and placed in a solvent bath having Unisol #199 supplied by the Pelron Corporation to remove the photo-resist and the asphalt varnish from the panel. The panel is then degreased with vaporized trichloroethylene, and, if desired, can be dipped in a hydrochloric acid solution to remove any oxide from the sheets 10 and 11.

Figure 6:
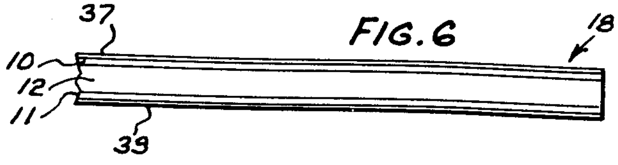
Fig. 6 is an elevation of the boards at a step in the method.
Figure 7:
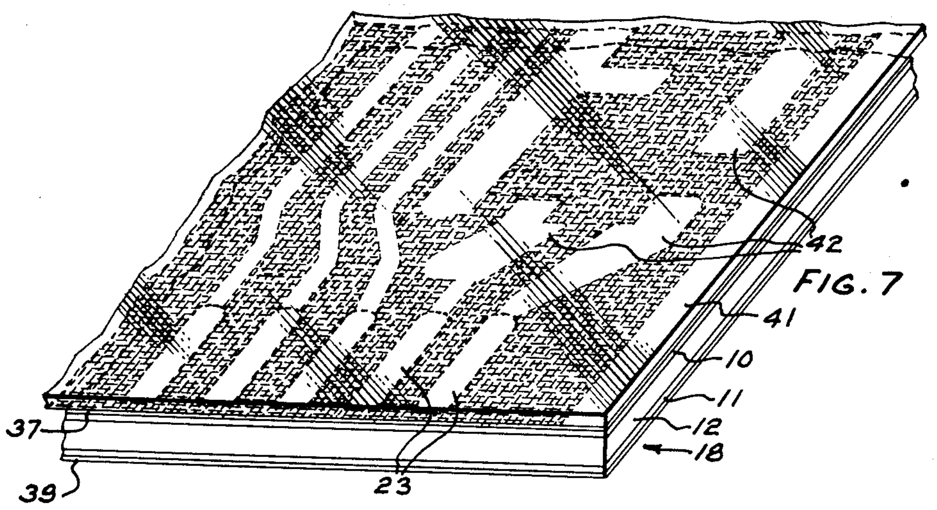
Figs. 7, 8 and 9 are perspective views of the boards at steps of the method.

One side of the panel then is sprayed with Kodak photo-resist to form a layer 37 (Figs. 6 and 7) which is air dried, and the photo-resist is sprayed on the other side of the panel to form a layer 39 and air dried. A third film negative 41, opaque except in transparent patterns 42 corresponding to printed wiring patterns 43 and including the terminals 23, is placed on the panel on the sheet 10 in a photographic aligning fixture (not shown) and registered precisely with the terminals 23 by pins placed through holes in the negative and the holes 16. Then the assembled panel and negative are placed in a vacuum frame and carbon arc light is projected on the negative 41 for five minutes to fix only the portions of the photo-resist layer 37 covered by the transparent patterns 42. This leaves wiring patterns 46 (Fig. 8) of photo-resist layer 37 on the foil 10. Then, a fourth negative (not shown), which is opaque except for the portions to cover terminals to be formed from the sheet 11, portions to cover indicia 47 (Fig. 9) representing connecting instructions to be formed from the sheet 11, and a grounding border 49, is placed on the resist covered sheet 11 with transparent portions in proper positions in the photographic aligning fixture by means of pins inserted through the holes 16 and matching holes in the negative. Then the panel with the negative is placed in the vacuum frame and carbon arc light is directed on the negative to fix only portions of the photo-resist layer 39 under the transparent portions of the negative. Then both sides of the panel are developed in Kodak developer to remove all unexposed photo-resist layers 37 and 39, dyed and then rinsed with water. The panel then is inspected for omissions of photo-resist, which, if present, are covered with white opaquing paint. This leaves the pattern 47 of photo-resist on the foil 11.

The panel then is etched for approximately twenty minutes in a 42° Baumé ferric chloride solution, which removes all portions of the sheets 10 and 11 which are not covered by the photo-resist to leave the wiring patterns 43 from the sheet 10, the terminals and indicia or connecting designations, and a ground border 49 from the sheet 11. The panel is rinsed in water, neutralized in a sodium bicarbonate solution, again rinsed in water, and placed in a Unisol bath which dissolves the photo-resist. The panel then is rinsed in water and scoured with steel wool and pumice. Water-dip lacquer is then applied to the panel and dried. Then the panel is sawed into pieces slightly larger than each wiring board and heated to 200° F. Individual boards 55 (Fig. 10) are punched therefrom which trims away all outside edge portions of the panel that may have become somewhat conductive. Circuit design holes 51 then are punched in the boards, the edges of the boards are deburred, and the terminal areas of the boards are wiped with lacquer thinner to remove lacquer from the terminals. Electrical components such as tubes, resistors, capacitors, and the like, then are mounted on and soldered to the printed circuits on the board to complete the board.

The above-described method produces printed wiring boards with very precisely located wiring and terminals thereon. The terminals have excellent contacting surfaces and the entire patterns are bonded strongly to the phenol-fiber boards without damage to the adhesive by the gold plating solution.

Certain features of the above-described method are disclosed and claimed in our copending application Serial No. 553,128, filed December 12, 1955, now Patent No. 2,861,029, for "Methods of Making Printed Wiring Circuits."

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

The method of making printed wiring boards, which comprises fixing photo-resist on a metal foil bonded to an insulating board in a pattern leaving a row of terminal portions of the foil not covered by photo-resist, fixing a masking tape to the covered foil in a position covering only the row of terminal portions, applying asphalt varnish to the portion of the photo-resist not covered by the tape, removing the tape, immersing the board in a gold-electroplating solution, electroplating gold on the terminal portions, removing the board from the solution, removing the asphalt varnish and the photo-resist, photo-printing a wiring pattern including the terminal portions on the foil in photo-resist, fixing the photo-resist on the foil, etching away the portions of the foil not covered by the photo-resist, and removing the photo-resist from the foil.

References Cited in the file of this patent

UNITED STATES PATENTS

| | | |
|---|---|---|
| 2,447,541 | Sabee et al. | Aug. 24, 1948 |
| 2,699,424 | Nieter | Jan. 11, 1955 |
| 2,734,150 | Beck | Feb. 7, 1956 |
| 2,777,192 | Albright et al. | Jan. 15, 1957 |
| 2,861,029 | Bain et al. | Nov. 18, 1958 |